United States Patent
Solanki et al.

(10) Patent No.: US 6,649,485 B2
(45) Date of Patent: Nov. 18, 2003

(54) METHOD FOR THE FORMATION AND LIFT-OFF OF POROUS SILICON LAYERS

(75) Inventors: Chetan Singh Solanki, Leuven (BE); Renat Bilyalov, Tielt Winge (BE); Jef Poortmans, Leuven (BE); Guy Beaucarne, Kingsford (AU)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 0 days.

(21) Appl. No.: 09/802,756

(22) Filed: Mar. 9, 2001

(65) Prior Publication Data

US 2001/0036747 A1 Nov. 1, 2001

Related U.S. Application Data

(60) Provisional application No. 60/188,347, filed on Mar. 9, 2000.

(30) Foreign Application Priority Data

Mar. 10, 2000 (EP) .............................. 00870040

(51) Int. Cl.[7] .............................. H01L 21/76
(52) U.S. Cl. ...................... 438/409; 438/960
(58) Field of Search ............ 117/89, 915; 136/258, 136/261; 257/13, 52, 79, 617; 438/22, 48, 96, 406, 409, 459, 482, 503, 504, 745, 753, 773, 960

(56) References Cited

U.S. PATENT DOCUMENTS

| | | | |
|---|---|---|---|
| 5,206,523 A | | 4/1993 | Goesele et al. |
| 6,326,280 B1 | * | 12/2001 | Tayanaka ............... 438/409 |
| 6,331,208 B1 | * | 12/2001 | Nishida et al. ........... 117/89 |
| 6,350,702 B2 | * | 2/2002 | Sakaguchi et al. ....... 438/753 |

FOREIGN PATENT DOCUMENTS

| | | |
|---|---|---|
| EP | 0 226 091 A2 | 6/1987 |
| EP | 0 797 258 A2 | 9/1997 |
| EP | 0 975 012 A2 | 1/2000 |

OTHER PUBLICATIONS

Bender, "Morphological properties of porous–Si layers for n+ –emitter applications", Applied Surface Science, vol. 147, p 187–200 (1999).*
T.J. Rinke, et al., "Quasi–monocrystalline silicon for thin–film devices", Applied Physics A, 68, 705–707 (1999).
H. Tayanaka, et al., "Thin–film crystalline silicon solar cells obtained by separation of a porous silicon sacrificial layer", 2$^{nd}$ World Conference and Exhibition of Photovoltaic Solar Energy Conversion, Vienna, Austria, 1272 (Jul. 6–10, 1998).
Bender, et al., "Morphological properties of porous–Si layers for n$^+$–emitter applications", Applied Surface Science, vol. 47, pp. 187–200), (1999).
Billat, et al., "Influence of etch stops on the microstructure of porous silicon layers", Thin Solid Films, vol. 297, pp. 22–25 (1997).
Ookubo, et al., "Microscope observation of a self–standing film of porous silicon", Materials Science and Engineering, vol. B20, pp. 324–327, (1993).
European Search Reports for European Application No. EP 00 87 0040, dated Aug. 28, 2000.

* cited by examiner

*Primary Examiner*—Kamand Cuneo
*Assistant Examiner*—Asok Kumar Sarkar
(74) *Attorney, Agent, or Firm*—Knobbe, Martens, Olson & Bear LLP

(57) ABSTRACT

A method for the manufacture, formation, and removal of porous layers in a semiconductor substrate having at least a surface acting as a cathode. The method comprises applying a solution comprising negative Fluorine (F$^-$) ions between the surface of the semiconductor substrate and an anode. The method further comprises applying a predetermined current between the anode and the cathode. The method further comprises maintaining the predetermined current at substantially the same current value for a sufficient amount of time to obtain a low porosity layer at said surface. A high porosity layer positioned under the low porosity layer is also obtained by the method of the invention.

14 Claims, 4 Drawing Sheets

PRIOR ART

METHOD FOR THE FORMATION AND LIFT-OFF OF POROUS SILICON LAYERS

This application claims priority from provisional application Ser. No. 60/188,347 filed Mar. 9, 2000 and application EP 00870040.3 filed Mar. 10, 2000.

FIELD OF THE INVENTION

The present invention is situated in the field of microelectronics, more precisely in the field of the formation of porous silicon layers (PSL) and its lift-off to manufacture Silicon On Insulator (SOI) structures or to bond it to other low-cost substrates for the fabrication of photovoltaic cells.

STATE OF THE ART

When manufacturing a solar cell, only the top few microns of a silicon wafer will participate actively in the conversion of solar energy. Most of the expensive silicon wafer will only provide mechanical strength to the cell. This function can be achieved by any other low-cost substrate compatible to the solar cell fabrication process. Thus cost reduction is possible by providing a reduction in the use of silicon.

Silicon on insulator (SOI) structures are well known in the art, for example in the manufacture of low-cost solar cells with high efficiency. Some of the advantages are prevention of latch-up, low parasitic capacitance, high-speed operation and the absence of a need for a welling process.

In general, the existing techniques for the formation of PSLs and to transfer them to other substrates can be seen in FIGS. 1A through 1F and involve the following three steps:

Formation in a silicon substrate 1 of a low porosity layer 2 on the surface and a high porosity layer 3 thereunder by anodisation of silicon in hydrofluoric acid by changing the current density during the PSL formation.

Formation of a separation layer 4 under the high porosity layer 3 by high temperature annealing in hydrogen. This separation layer is a highly porous layer and is mechanically very weak. It can easily be broken by little mechanical force, e.g. by ultrasonic treatment or pulling.

Bonding of the obtained structure to another substrate 5 using an adhesive 6.

This process is disclosed in FIGS. 1A through 1F.

These techniques have been discussed by H. Tayanaka et al., $2^{nd}$ world conference and exhibition on photovoltaic solar energy conversion, Vienna, Austria, 1272 (1998), and by T. J. Rinker et al., Applied Physics A, 68, 705–707 (1999).

Another approach, disclosed by T. Yonehara et al. in Electrical Society Proceedings, Volume 99-3, 111, uses mechanical grinding, selctive etching and hydrogen annealing for transferring thin silicon epi layers on the other substrate. The European patent application EP 0867920 discussed the use of a laser beam for the separation of the thin layer from the silicon substrate.

All of the above-mentioned procedures for forming a thin porous layer and separating it from the substrate involve multiple steps, some of which are complex. Each step adds to the cost of the SOI structure or solar cell.

AIMS OF THE INVENTION

The primary aim of the present invention is to provide a novel, one step method for the production of porous layer films. A further aim of the invention is to provide a novel method for the production of porous layer films that allows good control over the pore depth. Another aim of the present invention is to provide a novel method for the production of porous layer films in which the substrate is available without aftertreatment after lift-off of the porous layer film for the production of a further porous layer film.

SUMMARY OF THE INVENTION

The present invention concerns a method for the manufacture of porous layers in a semiconductor substrate, comprising the following steps:

Providing a semiconductor substrate comprising at least one surface, said substrate serving as an cathode, Providing a anode, Applying a solution comprising $F^-$ ions, suitable for removing material from said substrate, between said surface and said anode, Applying a predetermined current between said anode and said cathode, and Maintaining said solution and said current a sufficient amount of time to obtain a low porosity layer at said surface and a high porosity layer positioned under said low porosity layer.

With this novel method, a porous semiconductor film comprising a low porosity and a high porosity layer can be obtained with a one-step method, i.e. without changing any parameter. More specifically, the solution will not be replaced and the current will not be changed. For the purpose of the invention, layer shall be understood as a part of the substrate that can be distinguished from another part of the substrate.

The amount of time the current and the composition of the solution have to be maintained depends on the value of the current and of the concentration of the $F^-$ ions in the solution and can be determined by the person skilled in the art based on the examples as disclosed in the detailed description. A F– ion containing solution can be obtained by dissolving HF, a buffer solution containing $F^-$ ions, $NH_4F$, NaF or any other $F^-$ containing compound into an aqueous solution. Further, said solution preferably further comprises a wetting agent such as an organic solvent, preferably, but not limited to ethanol or acetic acid.

With the method of the invention, a porous layer comprising a low porosity layer and a high porosity layer positioned thereunder can thus be obtained.

The concentration of $F^-$ ions depends on the ionisation constant of the fluorine containing compound. Preferably, the concentration of $F^-$ in said solution is comprised between 10 and 40%.

Preferably, the value of said current is higher than 50 $mA/cm^2$. The upper limit of the current is usually determined by the equipment and/or material constraints.

The method of the present invention can further comprise the step of halting the application of current for a short time, and reapplying the current to obtain a higher thickness of the porous layers. Halting the application of the current will allow the hydrogen to escape before its pressure allows horizontal cracks to occur. By repeating this several time, a porous layer with a desired thickness can easily be obtained.

In a further embodiment, the method of the present invention can further comprise a mechanical treatment to obtain lift-off of said low porosity layer and part of said high-porosity layer from said substrate. Said mechanical treatment can be any of the known treatments such as ultrasonic treatment, pulling, etc . . . .

In a second further embodiment, the method of the present invention further comprises maintaining said solution and said current a further amount of time in order to obtain lift-off of said low porosity layer and a part of said high-porosity layer from said substrate. This allows obtaining a separated porous layer film which can be attached to a suitable low-cost substrate. Said separated porous layer film can comprise said low porosity layer and a part of said high porosity layer. Said part of said high porosity layer can be understood as no high porosity layer or a certain thickness lower than the high porosity layer before separation.

In a third further embodiment, the method of the present invention further comprises applying a second aqueous solution, suitable for electro-polishing the substrate and for providing separation and lift-off of the low porosity layer and a part of the high-porosity layer from the substrate and for providing a new polished surface on the substrate, while maintaining the current. An alternative way to obtain the same effects is to apply in a further step a higher current, suitable for electro-polishing the substrate and for providing separation and lift-off of the low porosity layer and a part of the high-porosity layer from the substrate and for providing a new polished surface on the substrate, while maintaining the solution. By using this process, the semiconductor substrate surface is polished after removal of the porous layers and thus no aftertreatment of the semiconductor substrate is necessary to proceed to the manufacture of a further porous layer film.

SHORT DESCRIPTION OF THE DRAWINGS

Figure 3A:
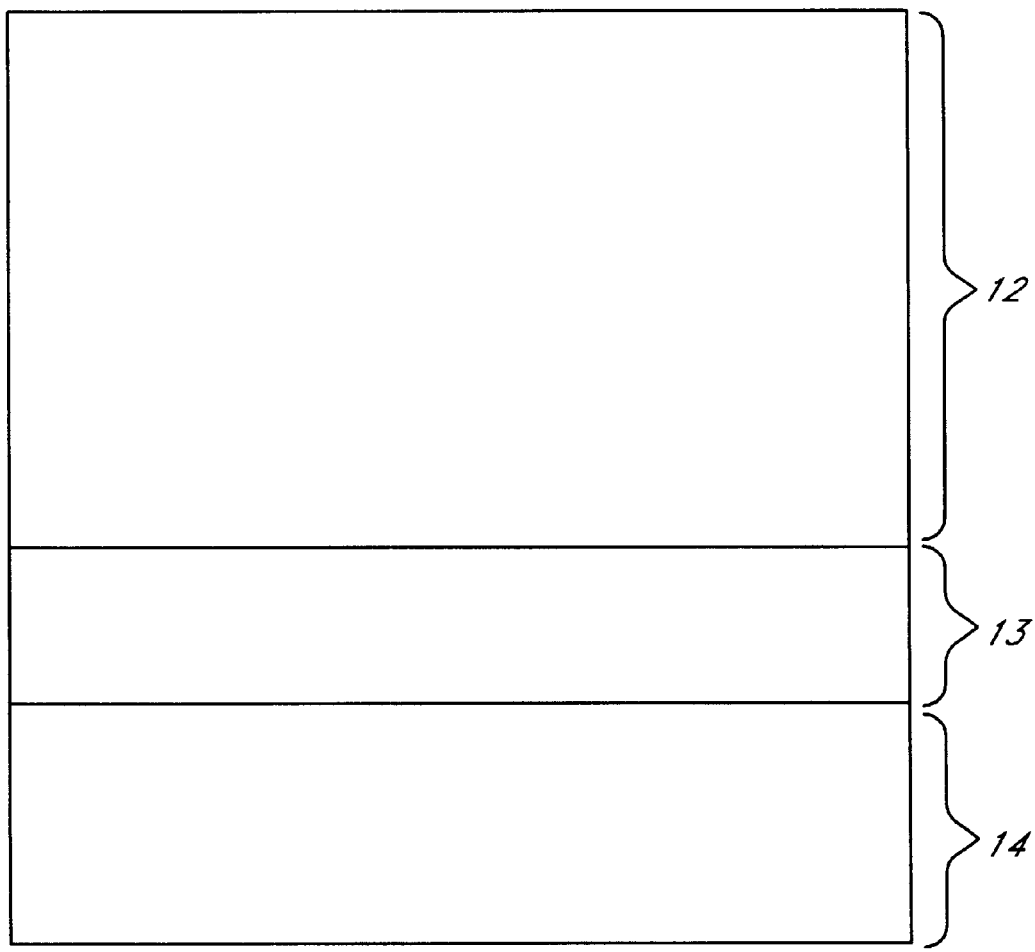
Figure 3B:
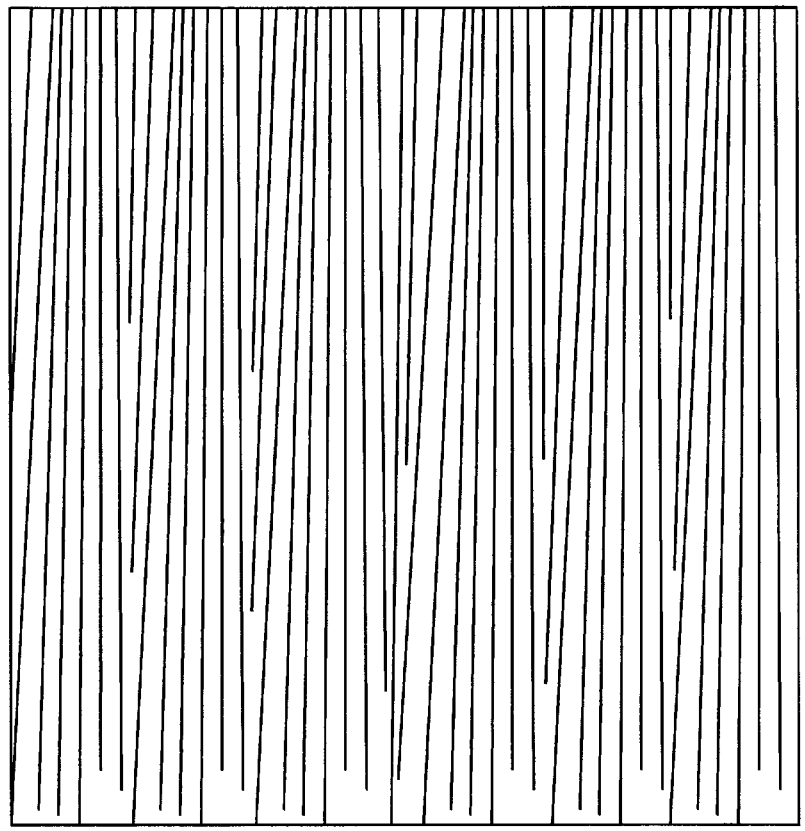

FIGS. 3A and 3B respectively are pictures of the interface between bulk silicon and porous layer just before separation and of the pore structure.

Figure 4:
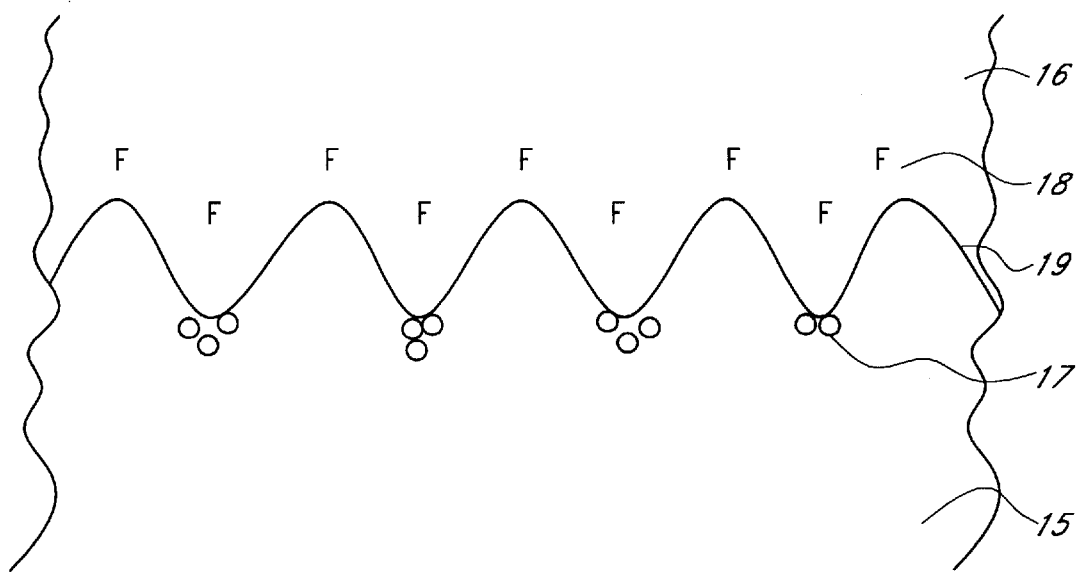

FIG. 4 illustrates the electrochemical etching reaction at the interface of the HF solution and silicon.

FIGS. 5A to 5D illustrate the porous silicon layer formation and its separation mechanism from the reusable substrate.

DETAILED DESCRIPTION OF THE INVENTION

In relation to the appended drawings the present invention is described in detail in the sequel. Several embodiments are disclosed. It is apparent however that a person skilled in the art can imagine several other equivalent embodiments or other ways of practicing the present invention, the spirit and scope thereof being limited only by the claims.

The present invention provides a simple technique of formation and lift-off (separation) of thin film from the substrate. With this approach the remaining wafer (after removing thin layer) can be used again as starting product for manufacturing more thin films.

The approach of the present invention of formation and separation of PSL requires only a single step as compared to the multiple, complex steps required in all other existing approaches. Porous silicon layers are formed by anodization, which is the electrochemical etching of silicon in the solution based on hydrofluoric acid. If one carries out the anodization for a sufficient time and for a given current density, pores travel straight down in the silicon. When a certain pore depth is reached, the concentration of fluoride at the point of the reaction decreases. Branching of the pores gives rise to the separation layer. The separated layer can be used for any desired use. Thus, in this way, one can avoid the following steps of the formation and separation of thin film from the substrate:

(a) No replacement of the solution comprising $F^-$ ions is required.

(b) No change in the current density is required for forming double porosity structure.

(c) No high temperature annealing in hydrogen is required for making the separation layer.

(d) No mechanical force is required to separate the layer from the substrate.

Another approach, which provides better control over the separation of the layer from the substrate, involves two steps. In the first step one carries out the electrochemical etching as stated above and in the second step one exploits an electro-polishing regime for the formation of the separation layer.

The present invention is described by reference to examples 1 to 4. The example 1 describes the set-up used for the porous silicon formation. Porous silicon formation and its separation from the reusable substrate by electrochemical etching are described in the example 2. Formation mechanism of a separation layer or a detached layer is described in the example 3. In example 4, the electrochemical reaction is limited by the fluoride ion in the solution, known as electro-polishing. The combination of electrochemical etching and electro-polishing with certain conditions can be used for the PSL and its separation from the reusable substrate.

EXAMPLE 1

Experimental Setup

Figure 1A:
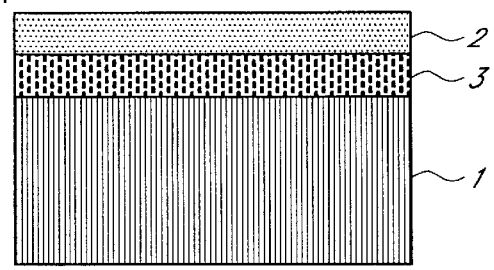
FIGS. 1A, 1B, 1C, 1D, 1E and 1F illustrate the prior art technique and shows the steps used for the formation of porous layer and its separation from the substrate.
Figure 1B:
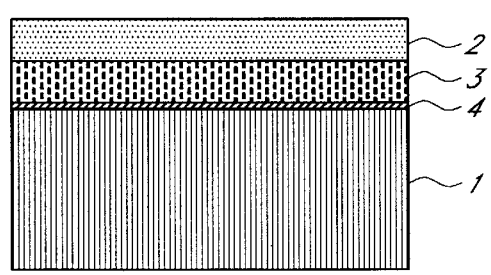
Figure 1C:
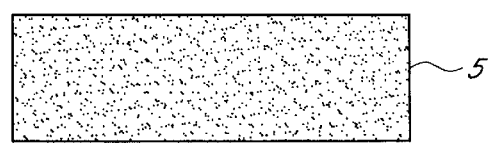
Figure 1D:
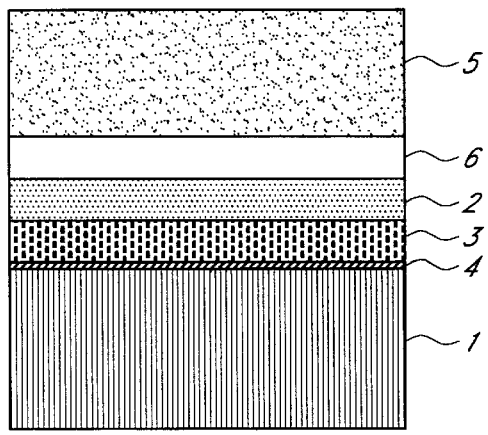
Figure 1E:
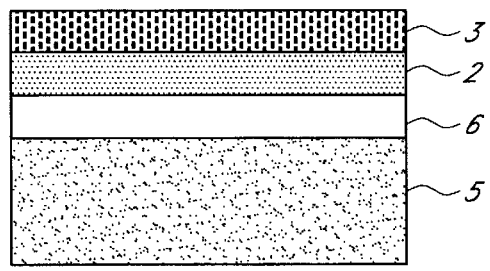
Figure 1F:
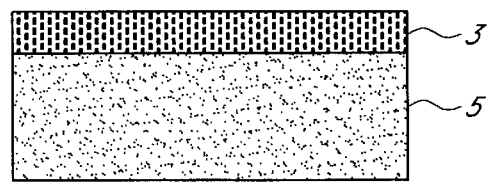
Figure 2:
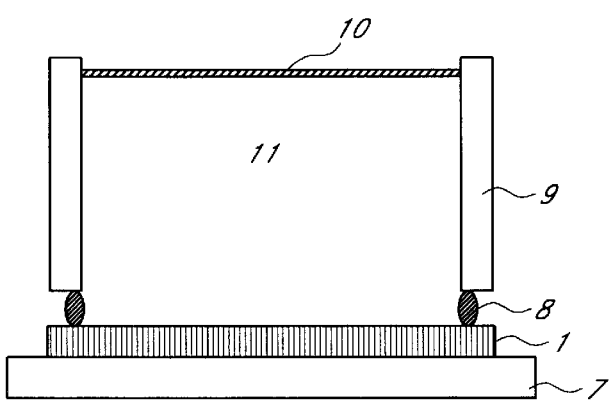
FIG. 2 illustrates the experimental set-up.

FIG. 2 illustrates the experimental set-up used for the porous silicon layer formation. Reference numeral 11 is the hydrofluoric acid solution. In the porous silicon formation the platinum electrode 10, which is resistant against hydrofluoric acid, acts as a negative electrode. The bottom plate 7 (e.g. stainless steel plate), which is in contact with the silicon wafer 1 (polished side up), acts as cathode. The rubber ring 8 prevents the outflow of the solution from the contact area of the Teflon® beaker 9 and wafer substrate 1. The rubber ring 8 is kept under pressure by the beaker 9, which in turn is pressurised by a stainless steel threaded ring (not shown).

EXAMPLE 2

Experiments were carried out with a mixture of HF, acetic acid and deionised water in which the concentration of HF varies between the different experiments from 10% to 40% and current density varies from 25 mA/cm$^2$ to 200 mA/cm$^2$. The acetic acid is used as a wetting agent, and provides enough functionality to obtain a good pore distribution. Ethanol could also be used, but for environmental reasons acetic acid is preferred. For a given current density and for a given HF concentration, formation of the separation layer or a very high porosity layer or a detached layer as shown in FIG. 3A is obtained when the reaction is continued after a certain time. The low porosity layer 12, high porosity (separation) layer 13 just before lift-off and silicon wafer substrate 14 are visible on FIG. 3A. For a 25% HF solution and for 150 MA/cm$^2$ current density this time is around 45–55 second and the thickness of the thin layer obtained is around 7 to 10 microns. Different layer thickness can be achieved by changing the current density and HF concentration in the solution. During the etching the pore extends downward in the silicon wafer as shown in FIG. 3B. Pores are not perfectly cylindrical in shape. For all experiments highly doped silicon wafers of orientation <100> were used.

EXAMPLE 3

Electrochemical etching of silicon occurs at the HF solution/silicon interface when subjected to the flow of current. When a hole coming from the bulk silicon reaches to the interface, the Si—H bonds is replaced by Si—F bond due to an attack by a fluoride ion from the HF solution. The polarization induced by these Si—F bond lowers the electron density of the Si—Si bond and these are broken too. Silicon dissolves as tetravalent silicon fluoride ($SiF_4$), which reacts with HF and produces fluorosilicic acid ($H_2SiF_6$). This electrochemical reaction is limited to the holes and results in pore formation. FIG. 4 illustrates the interface between bulk silicon and the HF solution where pore formation occurs. The numeral 15 indicates bulk silicon, 16 is the HF solution, 17 designates the holes, 18 are the fluoride ions and 19 is the interface.

Figure 5A:
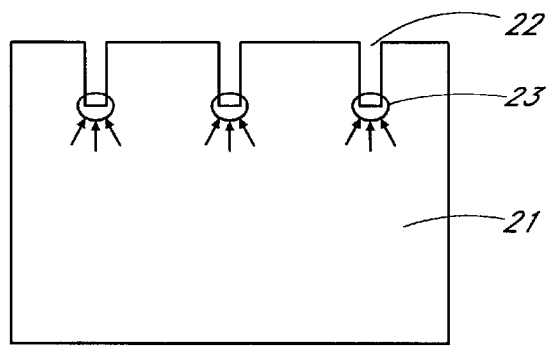

Once the pore formation starts at a certain position, it goes straight down in silicon as shown in FIGS. 5A through 5D. The numeral 21 indicates bulk silicon, 22 indicates pores and 23 indicates the point of reaction. When the pores are not deep enough the reaction occurs at the bottom of the pore as shown in FIG. 5A. At this time, there are sufficient fluoride ions available at the bottom but certainly less than the number of fluoride ions available at the surface since they have to diffuse through the pore to the point of reaction. Porosity of the layer increases with decrease in the concentration of HF in solution. Although the initial F– containing solution is not replaced, an in-situ change of concentration is obtained. Therefore as we go deeper, porosity of the layer increases. The porosity gradient occurs from the point where the availability of the fluoride ion is affected by the diffusion through pores.

Figure 5B:
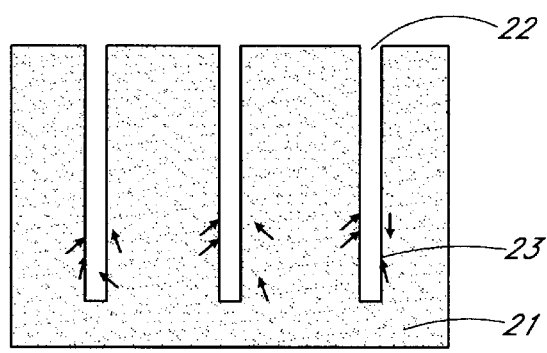
Figure 5C:
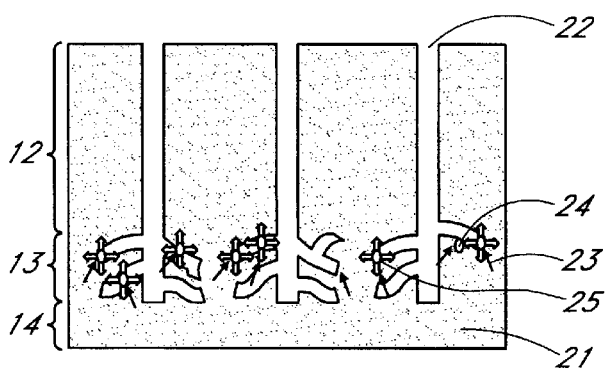
Figure 5D:
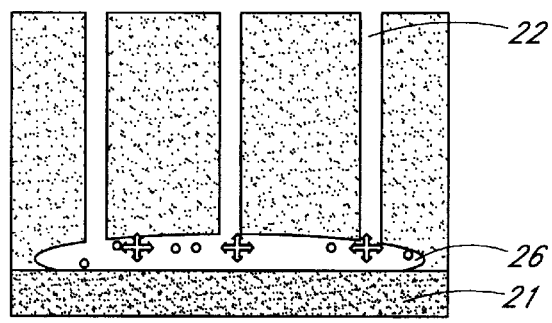

As pores go sufficiently deep in silicon, the fluoride ion concentration at the point of reaction reduces to a very low level as compared to the surface concentration. This results in the shift of the point of reaction to a slightly higher level because of very high resistance of the lowest part of the pore as shown in FIG. 5B. This shift in the reaction gives rise to the formation of the branches of the pores as shown in FIG. 5C. In FIG. 5C the numeral 24 indicates a hydrogen molecule and 25 is the direction of the hydrodynamic force exerted by the molecule. For every dissolution of a silicon atom, one hydrogen molecule results as a product of the electrochemical etching. The hydrogen molecules exert force on the walls of the pores. At some points, because of the branching of pores the walls becomes very thin and not able to withstand the hydrodynamic pressure exerted by the hydrogen molecules. This results in horizontal cracks 26 in the layer, 13 in FIG. 3A. The presence of sufficient horizontal cracks results in the separation of the layer 12 in FIG. 3A from the substrate, 14 in FIG. 3A. The layer can then detach from the substrate as shown in FIG. 5D.

EXAMPLE 4

For the case of 25% HF solution and 150 mA/cm² current density the separation of the PSL occurs at around 45–55 seconds. Because of the high current density, reaction occurs very fast. The centre portion of the layer gets detached with the wafer but the periphery remains attached with the silicon because of the construction of the experimental set-up. Therefore after the formation of separation layer if the reaction is allowed to continue, the by-product, hydrogen, gathers underneath the layer and exerts pressure on the film. The film breaks because of this pressure. Therefore, exact control of the reaction is required.

In another approach, which comprises two steps, one can exploit the use of electro-polishing together with the electrochemical etching for the formation of separation layer. For the purpose of this invention, polishing shall be understood as etching a rough surface such that the uneven topography of the surface decreases. Electrochemical etching is carried out with the set-up described in example 1. In the first step one forms porous silicon layer and in the second step changing the solution from high concentration to low concentration of F– results in electro-polishing. For example in the first step one uses 25% HF and 150 mA/cm² current density during 45 seconds. For the second step one uses a solution of low HF concentration, for example 17%. The reaction at the interface is limited by the fluoride ion concentration and electro-polishing at the interface of bulk silicon and porous layer occurs. The time required to form a separation layer in the second step varies from 60 seconds to 80 seconds. This electro-polishing effect can also be obtained by keeping the same solution, but changing (augmenting) the current.

In yet another approach, one can control the reaction that occurs at the deepest porous layer in such a way that no horizontal cracks occur. This can e.g. be done by halting the current for a short period just before the time that separation would normally occur, and then applying the current again for a short period. By doing this repeatedly, one can obtain high-thickness porous layers easily. A thickness of 70 µm is readily obtainable. Applying the current for a sufficient amount of time for horizontal cracks to occur can easily separate such thick porous layers from the substrate. Pausing the application of current allows the hydrogen to escape from the pores and can thus postpone the formation of horizontal crack due to hydrogen pressure.

What is claimed is:

1. A method of manufacturing porous layers in a semiconductor substrate, the method comprising:
   applying a solution comprising negative Fluorine (F–) ions between a surface of said semiconductor substrate and an anode;
   applying a predetermined first current between said anode and a cathode of said semiconductor substrate; and
   maintaining said solution, and maintaining said first current at substantially the same current value, for a sufficient amount of time to obtain a low porosity layer at said surface and a high porosity layer positioned under said low porosity layer, wherein at least said low porosity layer has a thickness suitable for removal and transfer from said substrate.

2. The method of claim 1, wherein the concentration of negative Fluorine ions in said solution is between 10% and 40%.

3. The method of claim 1, wherein the value of said first current is higher than 50 mA/cm².

4. The method of claim 1, further comprising halting the application of said first current for a short time, and reapplying said first current so as to obtain a higher thickness of the porous layers.

5. The method of claim 1, further comprising maintaining said solution and said first current a further amount of time so as to obtain lift-off of said low porosity layer and a portion of said high-porosity layer from said substrate.

6. The method of claim 1, further comprising a mechanical treatment which lifts off said low porosity layer and a portion of said high-porosity layer from said substrate.

7. The method of claim 1, further comprising applying a second aqueous solution, suitable for electro-polishing said substrate and for providing separation and lift-off of said low porosity layer and a portion of said high-porosity layer from said substrate, and for providing a new polished surface on said substrate, while maintaining said current.

8. The method of claim 1, further comprising applying a second higher current, suitable for electro-polishing said substrate and for providing separation and lift off of said low porosity layer and a part of said high-porosity layer from said substrate while maintaining said solution.

9. The method of claim 1, applying said solution comprises applying a solution suitable for removing material from said substrate.

10. A method for the formation and removal of porous layers in a semiconductor substrate, the method comprising:

applying a solution comprising negative Fluorine (F−) ions between a surface of said semiconductor substrate and an anode; and applying a current between said anode and a cathode of said semiconductor substrate and maintaining said current at substantially the same current value for a sufficient amount of time to obtain a low porosity layer at said surface and a high porosity layer positioned under said low porosity layer, wherein at least said low porosity layer has a thickness suitable for removal and transfer from said substrate.

11. The method of claim 10, wherein said solution further comprises a wetting agent.

12. The method of claim 11, wherein the wetting agent is an organic solvent.

13. The method of claim 10, further comprising obtaining said solution by dissolving a compound selected from the group consisting of HF, a buffer solution containing negative Fluorine ions, $NH_4F$, and NaF, into an aqueous solution.

14. A method for the manufacture of porous layers in a semiconductor substrate, comprising:

applying a solution comprising negative Fluorine (F−) ions, suitable for removing material from said substrate, between a surface of said semiconductor substrate and an anode;

applying a first current between said anode and a cathode of said semiconductor substrate a sufficient amount of time to obtain a low porosity layer at said surface and a high porosity layer positioned under said low porosity layer, wherein at least said low porosity layer has a thickness suitable for removal and transfer from said substrate.; and maintaining said solution and applying a second current a further amount of time so as to obtain lift-off of said low porosity layer and a portion of said high-porosity layer from said substrate.

* * * * *